United States Patent [19]

Weygandt et al.

[11] Patent Number: 4,760,541
[45] Date of Patent: Jul. 26, 1988

[54] TWO DIMENSIONAL DIGITAL SPATIAL FILTER FOR ENHANCEMENT OF POINT SOURCES

[75] Inventors: James P. Weygandt, Utica; Daniel C. Pultorak, Whitesboro; Richard L. Kies, Sauquoit, all of N.Y.

[73] Assignee: General Electric Company, Syracuse, N.Y.

[21] Appl. No.: 823,663

[22] Filed: Jan. 29, 1986

[51] Int. Cl.[4] .................... G06F 7/38; G06K 9/38
[52] U.S. Cl. ........................... 364/724; 382/53; 382/54
[58] Field of Search .................. 382/49–51, 382/53–54, 27; 358/166, 167, 282, 284; 364/715, 724

[56] References Cited

U.S. PATENT DOCUMENTS

| | | | |
|---|---|---|---|
| 3,341,814 | 9/1967 | Chow | 382/39 |
| 3,668,637 | 6/1972 | Sakai et al. | 382/51 |
| 4,003,024 | 1/1977 | Riganti et al. | 382/49 |
| 4,290,049 | 9/1981 | Sternberg et al. | 382/49 |
| 4,468,704 | 8/1984 | Stoffel et al. | 358/282 |
| 4,506,382 | 3/1985 | Hada et al. | 382/27 |
| 4,541,116 | 9/1985 | Lougheed | 382/49 |
| 4,703,513 | 10/1987 | Gennery | 382/27 |

Primary Examiner—Gary V. Harkcom
Assistant Examiner—Tan V. Mai
Attorney, Agent, or Firm—Carl W. Baker; Richard V. Lang

[57] ABSTRACT

A point source spatial filter determines the quality of a central point source or pixel under test to thereby detect point sources and minimize the signals from all sources other than the desired point source. The spatial filter incorporates a buffer apparatus for receiving pixel signals, memory apparatus for storing pixel data for the test pixel and surrounding pixels, comparator apparatus for comparing test pixel values against a given number of surrounding pixel values to determine if the test pixel is a local maximum or minimum value, subtraction apparatus for subtracting the value of the nearest-valued surrounding pixel from the test pixel value when the test pixel is determined to be a local maximum or minimum, and apparatus for indicating the difference between the value of the test pixel and that of the surrounding pixel of closest value. This difference value becomes the filter output, and serves to establish a value for the point source signal intensity which is then compared to a threshold to provide a detection flag.

9 Claims, 2 Drawing Sheets

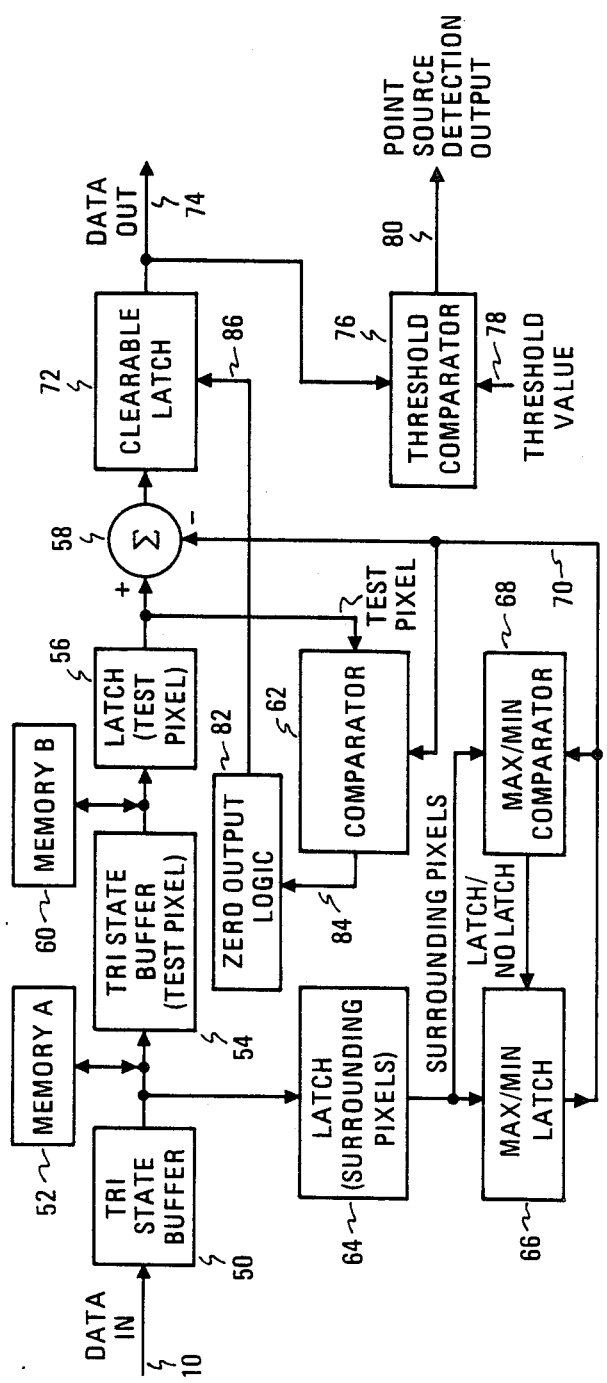
FIG. 2
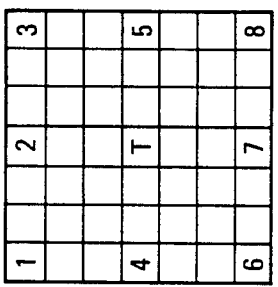
FIG. 3.3 7×7
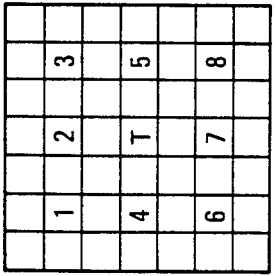
FIG. 3.2 5×5
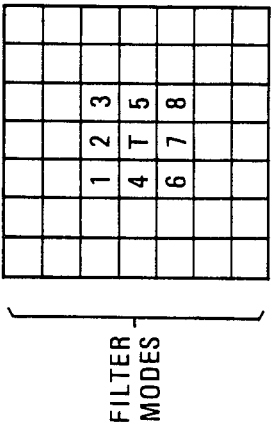
FIG. 3.1 3×3
FILTER MODES

TWO DIMENSIONAL DIGITAL SPATIAL FILTER FOR ENHANCEMENT OF POINT SOURCES

FIELD OF THE INVENTION

The present invention relates to object detection systems, and more particularly to systems for detecting point source signals in the presence of background noise.

BACKGROUND ART

In systems for the detection of point source signals in the presence of background clutter, interference or other noise, there is a common problem whether the system involves sonar, radar, infrared or video detection techniques. In such detection systems, the presence of a point source signal commonly is determined by comparing the level of the received signal against a "threshold" value which may be either fixed or adaptively adjusted in response to one or more system operating parameters. The value of this threshold level desirably is set as low as possible, to enhance system sensitivity and thus enable detection of weak signals, as from distant sources. If set too low, however, the system will respond to clutter and other background noise, which may overload the post-detection processor with too much data and result in an objectionably high false alarm rate (FAR).

To enable the lowest possible detection threshold while maintaining a satisfactory FAR, it is common to precede the thresholding comparator with background normalization means which removes or minimizes the unwanted sources and background clutter that is present around the point source being detected, thereby providing a spatially filtered output which indicates the signal intensity from the desired point source with minimal signal contributions from all other sources around the point source.

One such filter as generally implemented includes means for deriving a spatially filtered signal by calculating the average or mean signal level of the background surrounding the desired point source and subtracting this average background signal level from the point source signal. The spatially filtered signal then is compared with a threshold signal to determine if a point source signal is present. In this manner spatial filtering accentuates the difference between the point source signal and background clutter, which is basically the direct current (D.C.) content and which is eliminated through such subtraction.

The prior art spatial filter systems include independent horizontal and vertical high pass filters to remove the low frequency content of the scene. Every point source in the system field of view is treated the same in that the surrounding elements are multiplied by fixed values and summed with the original value. The output for any element thus contains portions of surrounding elements. The result is artifacts in the output which may also become detections. It is, therefore, desirable to eliminate these artifacts around the point source that are generally produced by the presently available filter systems.

It is accordingly an object of the present invention to provide a point source detection system which minimizes or eliminates the effect of artifacts located around the point source that are generally produced by current filtering methods. It is another object of the present invention to provide a spatial filter which minimizes false detections by minimizing the signals from all sources other than the desired point sources.

SUMMARY OF THE INVENTION

While as previously mentioned spatial filtering has application to radar, sonar and other object detection systems, as well as to electro-optical detection systems operating in both the visible and infrared spectral bands, the present invention will be described hereinafter in the particular context of an electro-optical detection system wherein a two-dimensional array of radiation-sensitive elements is scanned to obtain a measure of received signal level at each picture element ("pixel") over the array.

The point source spatial filter of this invention determines the quality of a central point source or pixel under test to thereby identify point sources and minimize interference from all sources other than that under test. The filter includes a plurality of buffers for receiving pixel signals and memory apparatus for storing pixel data for the test pixel and surrounding pixels. Generally, the spatial filter uses a given number of surrounding pixels, such as eight, to determine if the test pixel is a local maximum or minimum value and subtracts from the test pixel value the highest or lowest value out of those surrounding eight pixel values. The difference between the test pixel maximum value or the test pixel minimum value and its respective closest surrounding value becomes the filter output. If the test pixel is neither a maximum or minimum value, the output is zero.

Comparators associated with the buffers and memory devices provide comparisons to each of the surrounding pixels in sequence. The first pixel which is not equal to the test pixel in value determines whether the operation will look for a maximum or a minimum. For example, if the first pixel checked is less than the test pixel, then the test pixel is a possible maximum value. The search then continues for the maximum surrounding pixel value. If a later pixel is greater than the test pixel then the test pixel is neither a maximum or a minimum and the filter output for that pixel becomes zero.

The maximum or minimum value is found by latching the first surrounding pixel into a max/min latch and comparing each successive pixel value. If the search is for a maximum, then any value which exceeds the contents of the max/min latch will replace it. After all other surrounding pixels have been examined, if no value exceeds the test pixel then the difference between the test pixel and the pixel in the max/min latch becomes the output. If the test pixel is neither maximum or minimum then the filter output is zero. Thus, the filter output for a local maximum is the difference between the test pixel and the nearest surrounding value in magnitude. Similarly, for a local minimum the output is the difference between the test pixel and the nearest surrounding value. These output differences represent the test pixels which are either the local maximum or minimum pixel values and have been reduced in magnitude by the value of the surrounding pixel having the nearest value to the test pixel. Such maximum/minimum output differences serve to establish a value for the point source signal intensity which is then compared to a threshold to provide a detection flag.

In this fashion, the spatial filter of the present invention eliminates the signals from certain point sources and minimizes signals from all sources other than the desired point source thereby effectively lowering the detection threshold without concomitant increase in false alarm rate.

BRIEF DESCRIPTION OF THE DRAWINGS

FIG. 2 is a circuit block diagram of the spatial filter of the present invention; and FIGS. 3.1, 3.2 and 3.3 respectively show three pixel window arrangements for operating the spatial filter in three separate modes.

DESCRIPTION OF THE PREFERRED EMBODIMENTS

Figure 1:
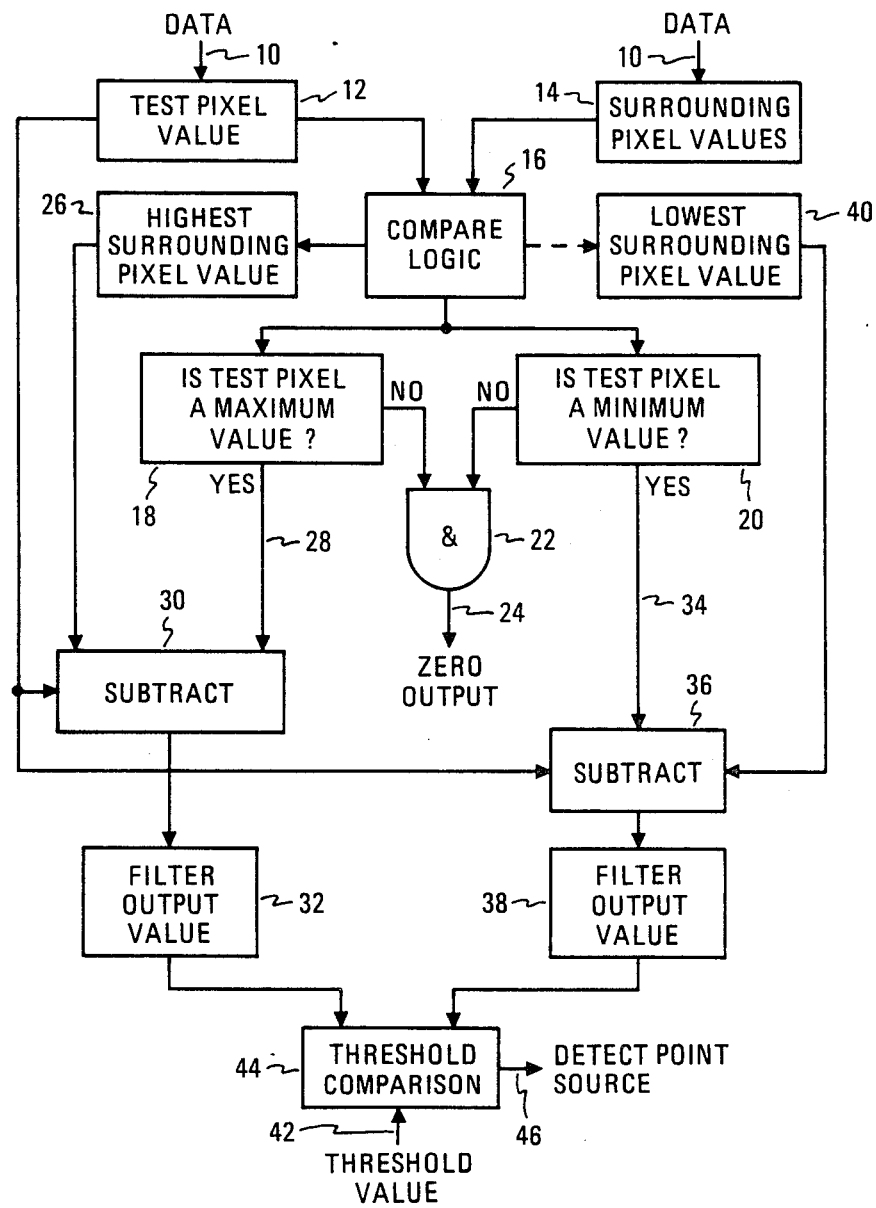
FIG. 1 is a block flow diagram of the operation of the point source spatial filter of the present invention.

Referring to FIG. 1 there is shown a block flow diagram of the method of operation of the point source spatial filter of the present invention. Here, pixel data is received on lines 10 with the test pixel value being stored at 12 and the surrounding pixel values being received and held at 14. In the examples to be described, eight surrounding pixel values will be evaluated and compared at 16 with the test pixel value 12. The comparison logic 16 determines whether the test pixel value is a maximum value at 18 or whether such test pixel value is a minimum value at 20. If the test pixel values are neither a maximum or minimum value, a logic gate or latch 22 provides a zero filter output on line 24.

The test pixel value at 12 is compared at 16 with each of the eight surrounding pixel values 14. The first pixel which is not equal to the test pixel determines whether the operation will look for a maximum or a minimum pixel value. That is, if the first pixel examined is less than the test pixel, then the test pixel is checked for a possible maximum and the search continues for the maximum surrounding pixel as indicated at 26. Similarly, if the first pixel checked is greater than the test pixel, then the test pixel becomes a possible minimum value as shown at 20. The search to determine whether the test pixel is a maximum value is carried out in the compare logic 16, wherein if a later pixel is greater in value than the test pixel then the test pixel is not a maximum value and this is indicated as a "NO" input to gate 22. If the minimum value search similarly results in a "NO" input to this gate, it will provide a "zero" filter output on line 24.

On the other hand, if the test pixel is a maximum value, this will result in an enable or gate signal on output line 28 to subtraction device 30, causing it to subtract the highest surrounding pixel value stored at 26 from the test pixel value 12 and to produce the filter output value at 32. In this fashion, the filter output for a local maximum test pixel is equal to the magnitude of the difference between the test pixel value and the highest or nearest in magnitude of the surrounding pixel values. Similarly, for a local minimum test pixel indicated at 20 and providing an enable signal on line 34 to subtraction device 36, the filter output value 38 is the magnitude of the difference between the test pixel value 12 and the lowest or nearest in magnitude surrounding pixel value 40 as determined in the compare logic 16. The filter output value at whichever of 32 and 38 is then producing an output is compared with a threshold value 42 at threshold comparison 44, and if the threshold is exceeded a point source detection is indicated at 46.

Referring to FIG. 2 there is shown a circuit block diagram of the spatial filter system of the present invention. Pixel data is received on line 10 and passed through a buffer 50. A first memory 52 receives the data from buffer 50 and stores both the test pixel value and the surrounding pixel values. The last surrounding pixel required for the filter operation is received in buffer 50 and written in the memory 52 as it is being used. A second buffer 54 is connected to the output of first buffer 50 and receives the test data and surrounding pixel data from memory 52 for subsequent outputting of such data via a latch 56 to a summing or subtraction device 58. A second memory 60 is used to store the test pixel value during a previous operation so that it will be available when needed and so that the surrounding eight pixels can be read using a clock eight times the pixel clock (not shown).

The test pixel can be passed from the memory 52 into the buffer 54 and further held by the latch device 56 for use in comparisons to be described. The test pixel is compared to each of the eight surrounding pixels by a comparator 62 connected to the output of latch device 56 and the output of a further latch device 64 which receives the values of the surrounding pixel. Comparator 62 compares the test pixel with the surrounding pixels. The first pixel which is not equal to the test pixel will thereby determine whether the operation searches for a maximum or a minimum. This is accomplished by comparing each surrounding pixel held in latch 64 with the test pixel held in latch 56. If the first pixel is less than the test pixel, then the test pixel is a possible maximum value. The maximum or minimum value is found by latching the first surrounding pixel held in latch 64 into a max/min latch 66 and using a comparator 68 to compare each successive surrounding pixel. When comparator 68 determines that the surrounding pixel held in latch 64 exceeds a possible minimum pixel value held in the max/min latch 66, then such examined pixel value will replace the contents of the max/min latch 66 and becomes the new possible maximum pixel value.

Thus, when the search is for a maximum pixel value, then any value which exceeds the contents in the max/min latch 66 will replace it. After all eight surrounding pixels have been examined, if no value exceeds the test pixel held in latch 56, then the difference between the test pixel and the pixel held on line 70 in max/min latch 66 becomes the output. This is provided by the summing device 58 which subtracts the pixel value in max/min latch 66 from the test pixel value in latch 56 and the magnitude of such difference is provided to a clearable latch 72 which produces the data output on line 74 from the spatial filter. It is noted that similarly, for a local minimum pixel value, the nearest or lowest pixel value of the surrounding pixels is held in the max/min latch 66 so that, at the end of the search, if no value is less than the test pixel value, then the output of the filter device becomes the magnitude of the difference between the test pixel value and the nearest or lowest surrounding value. As mentioned above, if the test pixel is neither a maximum or a minimum value, then the filter output is zero. A threshold comparator 76 compares the output in line 74 from the latch 72 with a threshold value on line 78 to detect a point source at its output line 80.

FIGS. 3.1, 3.2 and 3.3 respectively show three pixel arrangements having three modes of operation for the filter using different window sizes to provide different high spatial frequency responses. The mode is determined by the memory addressing and the window size is limited by the memory size. More particularly, FIG. 3.1 shows a 3×3 pixel window; FIG. 3.2 shows a 5×5 panel window; and FIG. 3.3 shows a 7×7 pixel window.

The spatial filter operation of the latches and comparators shown in FIG. 2 will now be described for a complete pixel operation for the pixels shown in FIGS. 3.1, 3.2 and 3.3. The clock, data, and outputs of the filter elements are listed in the table below.

TABLE

SPATIAL FILTER OPERATION (FIG. 2)

| PIXEL TIME CLOCK STATE | DATA IN (10) | 50 ENABLE +52 WRITE | 52 OUT | 64 OUT | 66 OUT | 60 WRITE 54 ENABLE | 60 OUT | 56 OUT | 58 OUT | 72 OUT |
|---|---|---|---|---|---|---|---|---|---|---|
| A | 8 | | $3_{-1}$ | $2_{-1}$ | ? | | | $T_{-1}$ | | |
| B | 8 | | 4 | $3_{-1}$ | ? | | T | $T_{-1}$ | | |
| C | 8 | | 5 | 4 | MAX OR MIN−1 | | T | $T_{-1}$ | DIFF | |
| D | 8 | | 6 | 5 | 4 | | | T | | DIFF OR $0^{-1}$ |
| E | 8 | | 7 | 6 | 4 or 5 | 7 | | T | | |
| F | 8 | 8 | | 7 | ? | | | T | | |
| G | 8 | | 1 | 8 | ? | | | T | | |
| H | 8 | | 2 | 1 | ? | | | T | | |
| A | $8_{+1}$ | | 3 | 2 | ? | | | T | | |
| B | $8_{+1}$ | | $4_{+1}$ | 3 | ? | | | T | | |
| C | $8_{+1}$ | | $5_{+1}$ | $4_{+1}$ | MAX OR MIN | | | T | DIFF | |
| D | $8_{+1}$ | | $6_{+1}$ | $5_{+1}$ | $4_{+1}$ | | | $T_{+1}$ | | DIFF OR 0 |

The above table indicates the outputs of the different spatial filter elements shown in FIG. 2 for the test pixel T and the eight surrounding pixels 1 through 8 during eight (8) pixel time clock states. While eight clock states (A through H) are required to perform one test pixel operation while the eight surrounding pixels are examined, the operations on a test pixel are not complete in all circuit elements during the eight states due to overlap in the shifting and latch operation. In the above table, the minus one (−1) and plus one (+1) subscripts respectively refer to the previous pixel or test pixel being operated on and the next pixel or test pixel being operated on. Thus, the $T_{-1}$ refers to the previous test pixel output from the test pixel latch 56 during the clock states B and C, while the $3_{-1}$ output of the surrounding pixel latch 64 during the clock state B refers to the surrounding pixel 3 for the previous pixel operation. Also, as described above, the system determines if the test pixel is a local maximum or minimum value and provides a filter output representing the magnitude of the difference between the test pixel value (maximum or minimum) and the closest surrounding pixel value when the test pixel is the largest or the smallest of the nine pixels. Otherwise, the filter output of latch 72 is zero. For this purpose, a zero output circuit 82, shown in FIG. 2, receives the comparator 62 output on line 84 and in turn provides a signal via line 86 to the clearable latch 72.

While the invention has been described above with respect to its preferred embodiments, it should be understood that other forms and embodiments may be made without departing from the spirit and scope of the invention.

What is claimed is:

1. A digital spatial filter for detecting a point source, comprising:
   means for storing values of a test pixel and a given number of surrounding pixels;
   means for comparing said stored value of said test pixel with each stored value of said surrounding pixels to determine if said test pixel value is a maximum or minimum value relative to said surrounding pixels;
   means for subtracting from the value of such maximum or minimum pixel value, the nearest value of said surrounding pixels to said maximum or minimum test pixel value to produce a filter output value; and
   threshold comparator means for comparing said filter output value with a threshold value for detecting a point source;
   whereby said spatial filter indicates intensity from point sources while providing minimal output from all other sources thereby minimizing false detections.

2. A spatial filter as recited in claim 1, and further comprising:
   latching means for latching a first surrounding pixel's value; and
   latch comparator means for comparing each successive pixel value with said latched pixel value so as to replace said latched pixel value with any subsequent pixel value which is greater than said latched pixel value when the value of the test pixel is greater than that of the latched pixel, and to replace said latched pixel value with any subsequent pixel value which is smaller than said latched pixel value when the value of the test pixel is smaller than that of the latched pixel.

3. A spatial filter as recited in claim 1, wherein said means for storing values of a test pixel and a given number of surrounding pixels includes means for storing eight values of pixels in a three-by-three pixel window surrounding said test pixel.

4. A spatial filter as recited in claim 1, wherein said means for storing values of a test pixel and a given number of surrounding pixels includes means for storing a given number of pixel values for pixels located in a five-by-five pixel window surrounding said test pixel.

5. A spatial filter as recited in claim 1 wherein said means for storing values of a test pixel and a given number of surrounding pixels includes means for storing a given number of pixels located in a seven-by-seven pixel window surrounding said test pixel.

6. A spatial filter system for detecting a point source, comprising:
   means for comparing the signal value of a point source test pixel with the signal values of a given number of surrounding pixels;

comparator means for determining whether said test pixel is a local maximum or minimum value relative to said surrounding pixel values;

output means responsive to said comparator means for providing a zero filter output where the value of said test pixel is determined to be neither a maximum or a minimum value, said output means providing a filter output that is the difference between said test pixel value and the highest value of a surrounding pixel where said test pixel is determined to be a maximum value, said output means providing a filter output that is the difference between the test pixel value and the lowest value of a surrounding pixel where the test pixel is determined to be a minimum value, and means for comparing said filter output with a threshold value for detecting a point source; whereby said spatial filter output indicates intensity from point sources while providing a minimal output from all other sources thereby minimizing false detections.

7. A method for detecting a point source with a spatial filter, comprising:

comparing the signal value of a point source test pixel with the signal values of a given number of surrounding pixels;

determining whether said test pixel is a local maximum or minimum value relative to said surrounding pixel values;

providing a zero filter output where the value of said text pixel is determined to be neither a maximum or a minimum value;

where said test pixel is determined to be a maximum value, providing a filter output that is the difference between the signal value of said test pixel and that of the highest-valued surrounding pixel;

where the test pixel is determined to be a minimum value, providing a filter output that is the difference between the signal value of said test pixel value and that of the lowest-valued surrounding pixel; and comparing said filter output with a threshold value for detecting a point source; whereby said spatial filter output indicates intensity from point sources while providing a minimal output from all other sources thereby minimizing false detections.

8. The method as recited in claim 7, wherein said step of determining whether said test pixel is a local maximum or minimum value comprises:

comparing each surrounding pixel value with said test pixel value;

storing the highest value of the surrounding pixels when a maximum test pixel value is present, and storing the lowest value of the surrounding pixels when a minimum test pixel value is present.

9. A method for detecting a point source with a spatial filter, comprising:

detecting the signal value of a test pixel;

storing the signal value for said test pixel;

comparing the test pixel value with the value of each of a given number of surrounding pixels to determine whether said test pixel value is a maximum or minimum value relative to the surrounding pixel values;

subtracting from the value of the maximum or minimum test pixel value, the value of that one of said surrounding pixels which is nearest-valued to said maximum or minimum test pixel to produce a filter output value; and comparing said filter output value with a threshold value for detecting a point source.

* * * * *